(12) United States Patent
An et al.

(10) Patent No.: US 11,699,633 B1
(45) Date of Patent: Jul. 11, 2023

(54) PRESSURE BALANCING CLAMP FOR PRESS-PACK INSULATED GATE BIPOLAR TRANSISTOR MODULE

(71) Applicant: Beijing University of Technology, Beijing (CN)

(72) Inventors: Tong An, Beijing (CN); Rui Zhou, Beijing (CN); Yakun Zhang, Beijing (CN); Fei Qin, Beijing (CN)

(73) Assignee: Beijing University of Technology, Beijing (CN)

( * ) Notice: Subject to any disclaimer, the term of this patent is extended or adjusted under 35 U.S.C. 154(b) by 0 days.

(21) Appl. No.: 18/148,986

(22) Filed: Dec. 30, 2022

(30) Foreign Application Priority Data

Jan. 28, 2022 (CN) .......................... 202210107019.0

(51) Int. Cl.
*H01L 23/40* (2006.01)
*H01L 23/473* (2006.01)
*F16F 15/04* (2006.01)

(52) U.S. Cl.
CPC ........ *H01L 23/4006* (2013.01); *H01L 23/473* (2013.01); *F16F 15/04* (2013.01); *H01L 2023/4025* (2013.01); *H01L 2023/4081* (2013.01); *H01L 2023/4087* (2013.01)

(58) Field of Classification Search
CPC ............... H01L 23/4006; H01L 23/473; H01L 2023/4025; H01L 2023/4081; H01L 2023/4087; F16F 15/04
USPC ........................................................ 257/719
See application file for complete search history.

(56) References Cited

FOREIGN PATENT DOCUMENTS

| CN | 103489856 | * | 1/2014 |
| CN | 104795348 | A | 7/2015 |
| CN | 106706963 | A | 5/2017 |
| CN | 106769490 | * | 5/2017 |
| CN | 107403772 | * | 11/2017 |
| CN | 107403772 | A | 11/2017 |
| CN | 108957036 | A | 12/2018 |
| CN | 210863940 | U | 6/2020 |
| CN | 112290773 | A | 1/2021 |

(Continued)

OTHER PUBLICATIONS

First Office Action issued in counterpart Chinese Patent Application No. 202210107019.0, dated Jul. 21, 2022.

*Primary Examiner* — Sheng-Bai Zhu
(74) *Attorney, Agent, or Firm* — Westbridge IP LLC

(57) ABSTRACT

Disclosed is a pressure balancing clamp for a press-pack insulated gate bipolar transistor (IGBT) module. The pressure balancing clamp for a press-pack IGBT module includes a bracket, where the bracket is provided with two longitudinally arranged pressure equalizing plates in a sliding way; the pressure equalizing plates are connected through pressure sensors; the upper and lower ends inside the bracket are respectively connected with the pressure equalizing plates through hydraulic devices and a displacement compensation device; opposite surfaces of the two pressure equalizing plates are respectively provided with heat dissipation and confluence devices. The pressure sensors are in one-to-one correspondence with the hydraulic devices and are electrically connected. The hydraulic devices adjust the pressure according to the readings of the pressure sensors in corresponding directions, so that the pressure of the press-pack IGBT module is balanced.

6 Claims, 2 Drawing Sheets

(56) References Cited

FOREIGN PATENT DOCUMENTS

| CN | 112630615 A | 4/2021 |
| CN | 112635413 A | 4/2021 |

\* cited by examiner

PRESSURE BALANCING CLAMP FOR PRESS-PACK INSULATED GATE BIPOLAR TRANSISTOR MODULE

CROSS-REFERENCE TO RELATED APPLICATIONS

This application claims priority to Chinese Patent Application No. 202210107019.0, filed on Jan. 28, 2022, the contents of which are hereby incorporated by reference.

TECHNICAL FIELD

The present application relates to the technical field of testing of a press-pack insulated gate bipolar transistor (IGBT) module, and in particular to a pressure balancing clamp for a press-pack IGBT module.

BACKGROUND

An insulated gate bipolar transistor (IGBT) is a commonly used power semiconductor device in power system. A press-pack IGBT module, as a kind of IGBT module with advanced packaging style, has the characteristics of high reliability, double-sided heat dissipation, failure short-circuit mode, etc., and has been widely used in the field of power grid.

When the press-pack IGBT module is operating, it is necessary to use a special clamp to provide the IGBT module with pressure, heat dissipation and lead connection. The rated pressure applied by the clamp clamps internal structures of the press-pack IGBT, so that a thermal contact resistance and a contact resistance between interfaces of the IGBT module are reduced to such a degree that the reliability of the module is not greatly affected. In practice, the pressure distribution on chips of the press-pack IGBT module is not uniform, and the chips may be crushed if the surface pressure of the chips is too high. If the surface pressure of the chips is too low, the thermal contact resistance and the contact resistance increase, resulting in the junction temperature rising and affecting the reliability of the chips. At present, among the clamps used to provide pressure to the modules, a pressure equalizing plate is used to provide the pressure to the press-pack modules as uniform as possible, and a pressure sensor is used to measure the total pressure applied by the clamps, but whether the pressure in all directions is uniform or not cannot be measured. At present, the clamps in use have many structural layers, so the installation and disassembly are complicated.

Therefore, it is necessary to propose a new clamp for the press-pack IGBT module, which uniformly applies pressure to the press-pack IGBT module, and also adjusts pressure when the applied pressure is not uniform, and has reduced number of structural layers. It is more convenient for this new clamp to adjust the pressure and install and disassemble, and the module used in this clamp are more reliable than the modules used in other clamps.

SUMMARY

Embodiments according to the present application aim to solve or improve at least one of the above-mentioned technical problems.

One aspect according to an embodiment of the present application is to provide a pressure balancing clamp for a press-pack insulated gate bipolar transistor (IGBT) module.

An embodiment of the one aspect of the present application provides the pressure balancing clamp for a press-pack IGBT module. The pressure balancing clamp for a press-pack IGBT module includes a bracket, where the bracket is slidably installed with pressure equalizing plates and two pressure equalizing plates are longitudinally arranged, and the pressure equalizing plates are connected with each other through pressure sensors; upper and lower ends of the bracket are connected with the pressure equalizing plates through hydraulic devices and a displacement compensation device respectively; opposite surfaces of the two pressure equalizing plates are respectively provided with heat dissipation and confluence devices; and two heat dissipation and confluence devices clamp and fix the press-pack IGBT module; at least three hydraulic devices are arranged and sequentially arranged along a circumferential direction of the press-pack IGBT module, and the pressure sensors are longitudinally arranged in one-to-one correspondence with the hydraulic devices, and the longitudinally corresponding hydraulic devices are electrically connected with the pressure sensors.

According to the application, the pressure balancing clamp for a press-pack IGBT module has a function of adjusting unbalanced pressure. The clamp adjusts the unbalanced pressure according to readings of the pressure sensors at corresponding positions between pressure equalizing plates at upper and lower ends. The pressure sensors are in one-to-one correspondence with and are electrically connected to the hydraulic devices, so that a single point location is controlled independently. Four readings of pressure sensors indicate the applied pressure in four directions, and the hydraulic devices adjust the pressure according to the readings in corresponding direction indicated by the pressure sensors, so the pressure of the press-pack IGBT module is balanced.

The application makes the pressure of the press-pack IGBT module more uniform, improves the reliability of the press-pack IGBT module, facilitates repeated processes of applying pressure, and facilitates the uniform pressure of chips inside the press-pack IGBT module.

The heat dissipation and confluence devices have functions of heat dissipation and confluence, reduce the number of layers of device performing functions of the application, and realize that the current directly flows in from a collector and flows out from an emitter, so as to avoid the current passing through liquid medium in a radiator and the heat dissipation efficiency of the radiator is not reduced.

In addition, the technical schemes provided according to the embodiment of the present application also have following additional technical features:

In any of the above technical schemes, the bracket includes: a lower top plate and an upper top plate. The lower top plate and the upper top plate are longitudinally arranged correspondingly, and opposite surfaces of the lower top plate and the upper top plate are connected by guide rods; the pressure equalizing plates are slidably connected with the guide rods by arranging guide holes; an upper surface of the lower top plate is fixedly connected with the displacement compensation device; and a lower surface of the upper top plate is fixedly connected with the hydraulic devices.

In this technical scheme, the lower top plate and the upper top plate are fixed and supported by guide rods, and the pressure equalizing plates are longitudinally moved and guided by the guide rods, and the lateral movement of the pressure equalizing plates is restricted. The lower top plate and the upper top plate are longitudinally correspondingly arranged, so that the longitudinal guidance of the guide rods is more accurate, thus avoiding the offset of the pressure equalizing plates. The displacement compensation device is arranged on the upper surface of the lower top plate, so as to compensate the displacement difference caused by pressure of the pressure equalizing plate at lower end, and the hydraulic device is arranged on the lower surface of the upper top plate, so as to output varied pressure to different point locations of the pressure equalizing plate at upper end.

In any of the above technical schemes, the upper top plate has a layout axis, four guide rods are arranged and are sequentially arranged along a circumferential direction of the layout axis of the upper top plate, and the hydraulic devices are arranged on a connecting line of the layout axis of the upper top plate and an axis of the guide rods.

In this technical scheme, by sequentially arranging four guide rods along the circumferential direction of the layout axis of the upper top plate, not only the whole device is supported more evenly and stably, but also the longitudinally moving pressure equalizing plates are guided more accurately. By arranging the hydraulic devices on the connecting line of the layout axis of the upper top plate and the axis of the guide rods, each hydraulic device corresponds to a guiding support point of one guide rod, and positional deviation and deflection of the pressure equalizing plates caused by varied output forces of the hydraulic devices are avoided and the posture of the pressure equalizing plates are ensured.

Specifically, the upper top plate and the lower top plate adopt square plates, and the axis at the center of the square plates is the layout axis.

In any of the above technical schemes, the displacement compensation device includes a disc spring. The lower surface of the pressure equalizing plate at lower end and the lower top plate are connected by the disc spring, and the disc spring longitudinally corresponds to the heat dissipation and confluence devices.

In this technical scheme, the pressure equalizing plate at lower end is supported and buffered by the disc spring, and when different forces are received, the pressure equalizing plate is more balanced to ensure that the posture does not shift. Moreover, the disc spring provides a certain downward movement and buffering ability, so that the pressure equalizing plate can be prevented from breaking in many tests.

In any of the above technical schemes, the displacement compensation device further includes a disc spring guide and a disc spring washer, where the disc spring washer is arranged at a joint of the disc spring and the lower top plate, and the disc spring guide is arranged at a joint of the pressure equalizing plate at lower end and the disc spring.

In this technical scheme, the joint between the disc spring and the lower top plate is contacted and buffered by the disc spring washer, so that a bottom end of the disc spring is prevented from being worn out in repeated pressure compression, and the normal service life of the disc spring is ensured in long-term tests. A compression direction of the disc spring is guided by the disc spring guide, so that the compression and reset directions of the disc spring and the moving direction of the pressure equalizing plate are more accurate, and a damage of the biased moving track to the disc spring is avoided, thus ensuring that a test is carried out smoothly and stably.

In any of the above technical schemes, the disc spring guide respectively penetrates through the disc spring and the disc spring washer, and is fixed in a through hole in a center of the lower top plate, and a lower surface of the disc spring guide is higher than a bottom surface of the lower top plate.

In this technical scheme, the disc spring guide penetrates through the disc spring and the disc spring washer respectively, so the disc spring guide is closer to the middle of the pressure equalizing plates, the disc spring and the disc spring washer. In this way, the difficulty of realizing single guide support in local position is avoid and a guiding function of the disc spring guide acts on the pressure equalizing plates, the disc spring and the disc spring washer is ensured at the same time.

In any of the above technical schemes, the heat dissipation and confluence devices include two heat dissipation and confluence structures. The two heat dissipation and confluence structures are symmetrically arranged up and down, and the opposite faces of the two pressure equalizing plates are respectively connected with the heat dissipation and confluence structures, and the heat dissipation and confluence structures clamp and fix the press-pack IGBT module.

In this technical scheme, the two heat dissipation and confluence structures are symmetrically arranged up and down, so that the press-pack IGBT module is clamped and fixed more accurately and stably. A lower surface of the heat dissipation and confluence structure at an upper end coincides with an upper surface of the collector of the press-pack IGBT module, and a lower surface of the press-pack IGBT module is matched with an upper surface of the heat dissipation and confluence structure at lower end in a same way. The current flows in from the heat dissipation and confluence structure at an upper end, flows into the collector of the press-pack IGBT module through surface contact, flows out from the emitter of the press-pack IGBT module, and then flows to the heat dissipation and confluence structure at lower end through surface contact and flows out.

In any of the above technical schemes, the heat dissipation and confluence devices further include: insulating plates, where the insulating plates are arranged at joints of the pressure equalizing plates and the heat dissipation and confluence structures.

In this technical scheme, the insulating plates isolate the circuit from other parts, and a center of a lower surface of the heat dissipation and confluence structure at lower end and a center of an upper surface of the insulating plate at lower end are perforated with round holes and positioned by positioning pins, and a center of a lower surface of the insulating plate at lower end and a center of an upper surface of the pressure equalizing plate at lower end are perforated with round holes and are positioned by positioning pins. The heat dissipation and confluence structure at upper end and the insulating plate at upper end, and the pressure equalizing plate at upper and the insulating plate at upper end are arranged in the same way. The connected current of the device is isolated to the outside, so as to avoid causing harm to external equipment and personnel.

In any of the above technical schemes, the side walls of the heat dissipation and confluence structures are provided with through holes, opposite faces of two heat dissipation and confluence structures are respectively provided with arc-shaped protrusions and strip-shaped grooves, and the strip-shaped grooves penetrate through the gaps of the arc-shaped protrusions, and confluence ends of the heat dissipation and confluence structures are provided with three lead-out holes.

In this technical scheme, through arranging the lead-out holes at the confluence ends of the heat dissipation and confluence structures, external power cables are conducted, so as to conduct the power of the press-pack IGBT module between the two heat dissipation and confluence structures. Through providing through holes on the side walls of the heat dissipation and confluence structures, after a water pipe is connected, the cooling liquid flows through the heat dissipation and confluence structures to provide the heat-dissipating function for the press-pack IGBT module. Through the arc-shaped protrusions, the clamped and fixed press-pack IGBT module is fixed more stably, and the strip-shaped grooves run through the gaps of the arc-shaped protrusions, so that the temperature of a shell of the press-pack IGBT module is conveniently measured by a thermocouple, and the strip-shaped grooves reserve space for the thermocouple.

In any of the above technical schemes, upper ends of the side walls of the guide rods are screwed with nuts, and lower surfaces of the nuts and the upper surface of the upper top plate clamp backing rings.

In this technical scheme, upper ends of the guide rods are provided with threads, and joints between unthreaded parts and threaded parts of the guide rods are provided with a horizontal plane. When the upper top plate penetrates through the guide rods downwards, the top plate is intercepted and supported by the horizontal plane. The upper top plate is pressed by screwing the nuts with the guide rods, so as to fix the upper top plate, and the backing rings are arranged to facilitate stable assembly of the nuts.

Additional aspects and advantages of embodiments according to the present application will become apparent in the following description, or may be learned by the practice of embodiments according to the present application.

DETAILED DESCRIPTION OF THE EMBODIMENTS

In order to have a clearer understanding of the above objectives, features and advantages of the present application, the present application will be further described in detail below with reference to the drawings and embodiments. It should be noted that the embodiments of the present application and the features in the embodiments can be combined with each other without conflict.

In the following description, many specific details are set forth in order to fully understand the present application. However, the present application can also be implemented in other ways different from those described here. Therefore, the protection scope of the present application is not limited by the specific embodiments disclosed below.

Figure 1:
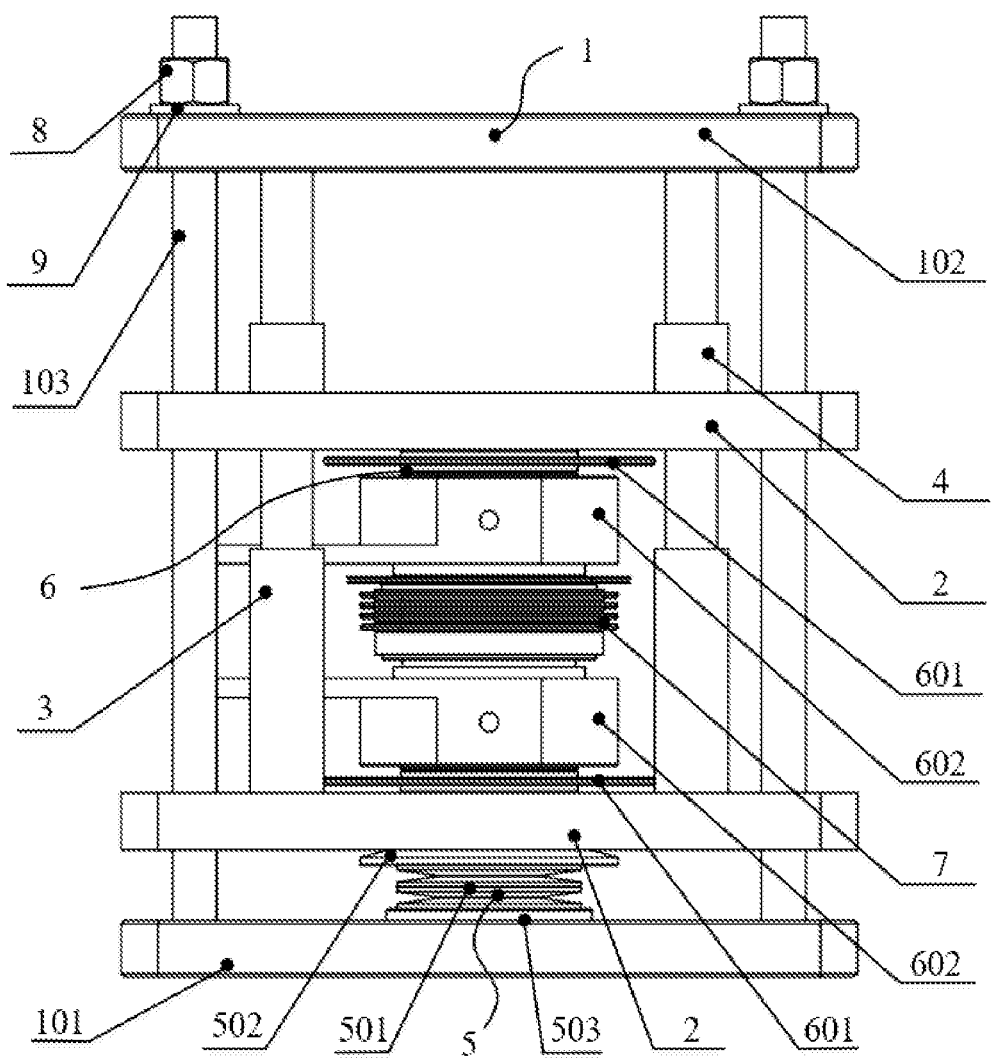
FIG. 1 is a structural schematic diagram of the present application.
Figure 2:
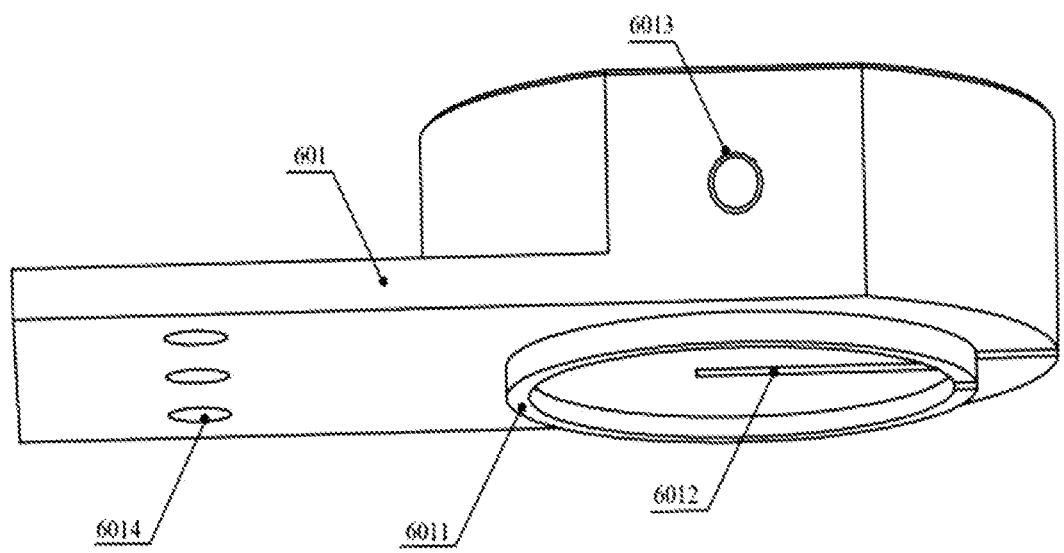
FIG. 2 is a schematic diagram of heat dissipation and confluence structures of the present application.

Referring to FIGS. 1-2, an embodiment of one aspect of the present application provides a pressure balancing clamp for a press-pack insulated gate bipolar transistor (IGBT) module 7. The pressure balancing clamp for a press-pack IGBT module 7 includes a bracket 1, where the bracket 1 is slidably installed with pressure equalizing plates 2; two pressure equalizing plates 2 are longitudinally arranged and the pressure equalizing plates 2 are connected with each other through pressure sensors 3; upper and lower ends inside the bracket 1 are respectively connected with the pressure equalizing plates 2 through hydraulic devices 4 and a displacement compensation device 5; opposite surfaces of the two pressure equalizing plates 2 are respectively provided with heat dissipation and confluence devices 6; and two heat dissipation and confluence devices 6 clamp and fix the press-pack IGBT module 7. There are at least three hydraulic devices 4, and the hydraulic devices 4 are sequentially arranged along a circumferential direction of the press-pack IGBT module 7, and the pressure sensors 3 are longitudinally arranged in one-to-one correspondence with the hydraulic devices 4, and the longitudinally corresponding hydraulic devices 4 are electrically connected with the pressure sensors 3.

According to the present application, the pressure balancing clamp for a press-pack IGBT module 7 has a function of adjusting unbalanced pressure. The pressure balancing clamp adjusts the unbalanced pressure according to readings of the pressure sensors 3 at corresponding positions between the pressure equalizing plates 2 at upper and lower ends. The pressure sensors 3 are in one-to-one correspondence with the hydraulic devices 4 and the pressure sensors 3 are electrically connected to the hydraulic devices 4, so that a single point location is independently controlled. Four readings of the pressure sensors 3 indicate the applied pressure in four directions, and the hydraulic devices 4 adjust the pressure according to the readings of the pressure sensors 3 in the corresponding directions, so as to balance the pressure of the press-pack IGBT module 7.

The present application makes the pressure of the press-pack IGBT module 7 more uniform, improves the reliability of the press-pack IGBT module 7, facilitates repeated processes of pressure application, and facilitates the uniform pressure of chips inside the press-pack IGBT module 7.

The heat dissipation and confluence devices 6 have functions of heat dissipation and confluence, reduces the number of layers of the function realization device of the present application, and realizes the current route that the current directly flows in from a collector and flows out from an emitter, thus avoiding the current from passing through a liquid medium in a radiator and not reducing the heat dissipation efficiency of the radiator.

Specifically, the hydraulic devices 4 adopt hydraulic rods, so that it is convenient for own structural shapes to select axes of hydraulic devices while the longitudinal direction pushing is ensured.

Specifically, bottom ends of the pressure sensors are fixedly connected with the pressure equalizing plate at lower end, and top detection ends of the pressure sensors abut against the pressure equalizing plate at upper end.

Specifically, an upper top plate, the pressure equalizing plates, and a lower top plate are longitudinally overlapped, so as to keep a center of gravity of the whole device and the stable setting during clamping detection.

In any of the above embodiments, as shown in FIGS. 1-2, the bracket 1 includes: the lower top plate 101 and the upper top plate 102. The lower top plate 101 and the upper top plate 102 are longitudinally arranged in correspondence with each other, and opposite faces of the lower top plate 101 and the upper top plate 102 are connected by guide rods 103. The pressure equalizing plates 2 are slidably connected with the guide rods 103 by opening guide holes, an upper surface of the lower top plate 101 is fixedly connected with the displacement compensation device 5, and a lower surface of the upper top plate 102 is fixedly connected with the hydraulic devices 4.

In this embodiment, the lower top plate 101 and the upper top plate 102 are fixed and supported by the guide rods 103, and the guide rods 103 move and guide the pressure equalizing plates 2 longitudinally, and restricts lateral movements of the pressure equalizing plates 2. The lower top plate 101 and the upper top plate 102 are arranged longitudinally correspondingly, so that a longitudinal guidance of the guide rods 103 is more accurate, and an offset of the pressure equalizing plates 2 is avoided. The displacement compensation device 5 is arranged on the upper surface of the lower top plate 101, so a displacement difference of the pressure equalizing plate 2 at lower end is compensated, and the hydraulic devices 4 are arranged on the lower surface of the upper top plate 102, so that varied pressure are output to different point locations of the pressure equalizing plate 2 at upper end.

In any of the above embodiments, as shown in FIGS. 1-2, the upper top plate 102 has a layout axis, and four guide rods 103 are provided. The four guide rods 103 are sequentially arranged along a circumferential direction of the layout axis of the upper top plate 102. The hydraulic devices 4 are arranged on a connecting line between the layout axis of the upper top plate 102 and axes of the guide rods 103.

In this embodiment, by sequentially arranging four guide rods 103 along the circumferential direction of the layout axis of the upper top plate 102, not only the whole device is supported more evenly and stably, but also the longitudinally moving pressure equalizing plates 2 is guided more accurately. By arranging the hydraulic devices 4 on the connecting line between the layout axis of the upper top plate 102 and the axes of the guide rods 103, each hydraulic device 4 corresponds to a guide support point of one guide rod 103, so the offset of the pressure equalizing plates 2 is avoided due to varied forces output by the hydraulic devices 4, thus ensuing stable and correct posture of the pressure equalizing plates 2.

In any of the above embodiments, as shown in FIGS. 1-2, the displacement compensation device 5 includes a disc spring 501. A lower surface of the pressure equalizing plate 2 at lower end and the lower top plate 101 are connected by the disc spring 501, and the disc spring 501 longitudinally corresponds to the heat dissipation and confluence devices 6.

In this embodiment, the pressure equalizing plate 2 at lower end is supported and buffered by the disc spring 501, and when varied forces are received, the pressure equalizing plate 2 is more balanced to ensure that the posture does not shift, and the disc spring 501 provides a certain downward movement and buffering ability, so that the pressure equalizing plate 2 is prevented from breaking in many tests.

In any of the above embodiments, as shown in FIGS. 1-2, the displacement compensation device 5 further includes a disc spring guide 502 and a disc spring washer 503. The disc spring washer 503 is arranged at a joint of the disc spring 501 and the lower top plate 101, and the disc spring guide 502 is concentrically matched with a central hole in a center of the lower top plate 101, and a lower surface of the disc spring guide 502 is higher than a lower surface of the lower top plate 101.

In this embodiment, the joint between the disc spring 501 and the lower top plate 101 is contacted and buffered by the disc spring washer 503, so that a bottom end of the disc spring 501 is prevented from being worn out in repeated compression, and a normal service life of the disc spring 501 is ensured in long-term tests. A compression direction of the disc spring 501 is guided by the disc spring guide 502. This makes the compression and reset direction of the disc spring 501 and the moving direction of the pressure equalizing plate 2 more accurate, avoids the damage to the disc spring 501 caused by the biased moving track, and ensures the smooth and stable implementation of the tests.

In any of the above embodiments, as shown in FIGS. 1-2, the disc spring guide 502 penetrates through the disc spring 501 and the disc spring washer 503, respectively, and is fixed in a through hole in the center of the lower top plate 101. The lower surface of the disc spring guide 502 is higher than a bottom surface of the lower top plate 101.

In this embodiment, the disc spring guide 502 penetrates through the disc spring 501 and the disc spring washer 503 respectively, so that the disc spring guide 502 is closer to a middle of the pressure equalizing plate 2, the disc spring 501 and the disc spring washer 503, and the difficulty of single guide support in local position is avoided, and ensures that a guiding function of the disc spring guide 502 simultaneously acts on the pressure equalizing plate 2, the disc spring 501 and the disc spring washer 503.

In any of the above embodiments, as shown in FIGS. 1-2, the heat dissipation confluence devices 6 include two heat dissipation and confluence structures 601. The heat dissipation and confluence structures 601 are symmetrically arranged up and down. The opposite faces of the two pressure equalizing plates 2 are connected to the heat dissipation and confluence structures 601, respectively, and the two heat dissipation and confluence structures 601 clamp and fix the press-pack IGBT module 7.

In this embodiment, the two heat dissipation and confluence structures 601 are symmetrically arranged up and down, so that the press-pack IGBT module 7 is clamped and fixed more accurately and stably. A lower surface of the heat dissipation and confluence structure 601 at upper end coincides with an upper surface of the collector of the press-pack IGBT module 7, and a lower surface of the press-pack IGBT module 7 is matched with an upper surface of the heat dissipation and confluence structure 601 at lower end in a same way. The current flows in from the heat dissipation confluence structure 601 at upper end, flows into the collector of the press-pack IGBT module 7 through surface contact, flows out from the emitter of the press-pack IGBT module 7, flows to the heat dissipation confluence structure 601 at lower end through surface contact, and then flows out.

In any of the above-mentioned embodiments, as shown in FIGS. 1-2, the heat dissipation and confluence devices 6 further include: insulating plates 602, and the insulating plates 602 are disposed at joints of the pressure equalizing plates 2 and the heat dissipation and confluence structures 601.

In this embodiment, the insulating plates 602 isolate the circuit from other parts. A center of a lower surface of the heat dissipation and confluence structure 601 at lower end and a center of an upper surface of the insulating plate 602 at lower end are perforated with round holes, and are positioned by positioning pins. A center of a lower surface of the insulating plate 602 at lower end and a center of an upper surface of the pressure equalizing plate 2 at lower end are perforated with round holes and are positioned by positioning pins. The heat dissipation and confluence structure 601 at upper and the insulating plate 602 and the pressure equalizing plate 2 and the insulating plate 602 are arranged in the same way, and the connected current of the device is isolated to the outside, so as to avoid damage to external equipment and personnel.

Specifically, the current in the heat dissipation confluence devices flows in from the heat dissipation and confluence structure at upper end, flows into the collector of the press-pack IGBT module through surface contact, flows out from the emitter of the press-pack IGBT module, and then flows out from the heat dissipation and confluence structure at lower end through surface contact. The insulating plates at upper and lower ends isolate the circuit from other parts of the device.

In any of the above embodiments, as shown in FIGS. 1-2, through holes 6013 are formed in side walls of the heat dissipation and confluence structures 601, and arc-shaped protrusions 6011 and strip-shaped grooves 6012 are respectively formed on opposite surfaces of the two heat dissipation and confluence structures 601. The strip-shaped grooves 6012 run through gaps of the arc-shaped protrusions 6011, and three lead-out holes 6014 are formed at confluence ends of heat dissipation and confluence structures 601.

In this embodiment, through arranging lead-out holes 6014, external power cables are conducted, so as to conduct the power of the press-pack IGBT module 7 between the two heat dissipation and confluence structures 601. The through holes 6013 are formed in the side walls of the heat dissipation and confluence structures, and after a water pipe is connected, a coolant flows through the heat dissipation and confluence structures 601 to provide a heat-dissipating function for the press-pack IGBT module 7. The arc-shaped protrusions 6011 fix the press-pack IGBT module 7 clamped and fixed more stably, and the strip-shaped grooves 6012 run through the gaps of the arc-shaped protrusions 6011, so that the temperature of a shell of the press-pack IGBT module 7 is conveniently measured by a thermocouple, and the strip-shaped groove reserve space for the thermocouple.

In any of the above embodiments, as shown in FIGS. 1-2, upper ends of the side walls of the guide rods 103 are screwed with the nuts 8, and lower surfaces of the nuts 8 and an upper surface of the upper top plate 102 clamp backing rings 9.

In this embodiment, upper ends of the guide rods 103 are provided with threads, and joints between unthreaded parts and threaded parts of guide rods 103 are provided with a horizontal plane. When the upper top plate 102 penetrates through the guide rods 103 downward, the upper top plate 102 is intercepted and supported by the horizontal plane. The nuts 8 are screwed with the guide rods 103 to press the upper top plate 102, so that the upper top plate 102 is fixed, and backing rings 9 are added for facilitating to assemble the nuts 8 stably.

In the description of the present application, it should be understood that directional or positional relations defined by terms "longitudinal", "horizontal", "upper", "lower", "front" "rear", "left", "right", "vertical", "transverse", "top", "bottom", "inside", and "outside" are based on directional or positional relations and are only for describing the present application, rather than indicating or implying that the device or elements must be in designated direction, or configured or operated in designated direction so that they cannot be understood as the limitation of this application.

The above-mentioned embodiments only describe the preferred mode of the present application, but do not limit the scope of the present application. On the premise of not departing from the design spirit of the present application, all kinds of modifications and improvements made by ordinary technicians in the field to the technical scheme of the present application shall fall within the scope of protection determined by the claims of the present application.

What is claimed is:

1. A pressure balancing clamp for a press-pack insulated gate bipolar transistor (IGBT) module, comprising: a bracket, wherein the bracket is slidably installed with pressure equalizing plates, and two pressure equalizing plates are longitudinally arranged, and the pressure equalizing plates are connected with each other through pressure sensors; upper and lower ends inside the bracket are respectively connected with the pressure equalizing plates through hydraulic devices and a displacement compensation device; opposite faces of the two pressure equalizing plates are respectively provided with heat dissipation and confluence devices, and the two heat dissipation and confluence devices clamp and fix the press-pack IGBT module;
   wherein at least three hydraulic devices are arranged and are sequentially arranged along a circumferential direction of the press-pack IGBT module, the pressure sensors and the hydraulic devices are longitudinally arranged in one-to-one correspondence, and the longitudinally corresponding hydraulic devices and the pressure sensors are electrically connected, and the hydraulic devices adjust according to pressure sensed by the pressure sensors in corresponding directions;
   the bracket comprises a lower top plate and an upper top plate, wherein the lower top plate and the upper top plate are longitudinally arranged correspondingly, and opposite surfaces are connected by guide rods; and the pressure equalizing plates are slidably connected with the guide rods by opening guide holes; an upper surface of the lower top plate is fixedly connected with the displacement compensation device, and a lower surface of the upper top plate is fixedly connected with the hydraulic devices;
   the heat dissipation and confluence devices comprise heat dissipation and confluence structures; two heat dissipation and confluence structures are symmetrically arranged up and down, and the opposite faces of the two pressure equalizing plates are respectively connected with the heat dissipation and confluence structures, and the two heat dissipation and confluence structures clamp and fix the press-pack IGBT module;
   the heat dissipation and confluence devices further comprise insulating plates, and the insulating plates are arranged at joints of the pressure equalizing plates and the heat dissipation and confluence structures; and
   through holes are formed in side walls of the heat dissipation and confluence structures, and arc-shaped protrusions and strip-shaped grooves are respectively arranged on opposite surfaces of the two heat dissipation and confluence structures, and the strip-shaped grooves run through gaps of the arc-shaped protrusions; confluence ends of the heat dissipation and confluence structures are provided with three lead-out holes.

2. The pressure balancing clamp for a press-pack IGBT module according to claim 1, wherein the upper top plate has a layout axis, four guide rods are arranged and are arranged sequentially along a circumferential direction of the layout axis of the upper top plate, and the hydraulic devices are arranged on a connecting line between the layout axis of the upper top plate and axes of the guide rods.

3. The pressure balancing clamp for a press-pack IGBT module according to claim 1, wherein the displacement compensation device comprises a disc spring; a lower surface of the pressure equalizing plate at lower end and the lower top plate are connected by the disc spring, and the disc spring longitudinally corresponds to the heat dissipation and confluence devices.

4. The pressure balancing clamp for a press-pack IGBT module according to claim 3, wherein the displacement compensation device further comprises a disc spring guide and a disc spring washer, wherein the disc spring washer is arranged at a joint of the disc spring and the lower top plate, and the disc spring guide is arranged at a joint of the pressure equalizing plate at lower end and the disc spring.

5. The pressure balancing clamp for a press-pack IGBT module according to claim 4, wherein the disc spring guide penetrates through the disc spring and the disc spring washer respectively, and is fixed in a central hole in a center of the lower top plate, and a lower surface of the disc spring guide is higher than a bottom surface of the lower top plate.

6. The pressure balancing clamp for a press-pack IGBT module according to claim 1, wherein upper ends of side walls of the guide rods are screwed with nuts, and lower surfaces of the nuts and an upper surface of the upper top plate clamp backing rings.

* * * * *